(12) United States Patent
Hidese et al.

(10) Patent No.: US 6,539,622 B2
(45) Date of Patent: *Apr. 1, 2003

(54) ELECTRONIC COMPONENTS MOUNTING DEVICE AND THE MOUNTING METHOD

(75) Inventors: Wataru Hidese, Fukuoka (JP); Yusuke Yamamoto, Fukuoka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,459

(22) Filed: Dec. 6, 1999

(65) Prior Publication Data

US 2002/0124397 A1 Sep. 12, 2002

(30) Foreign Application Priority Data

Dec. 7, 1998 (JP) ............................ 10-346347

(51) Int. Cl.[7] ................................. H05K 3/30
(52) U.S. Cl. .............................. 29/832; 29/834; 29/836; 29/740; 29/743; 198/358
(58) Field of Search ............................ 83/929.1, 929.2; 198/358; 29/832, 834, 836, 740, 741, 833, 743

(56) References Cited

U.S. PATENT DOCUMENTS

| | | | |
|---|---|---|---|
| RE33,780 E | | 12/1991 | Itagaki et al. |
| 5,743,005 A | * | 4/1998 | Nakao ............... 29/833 |
| 6,000,123 A | * | 12/1999 | Munezane ........... 29/240 |
| 6,079,096 A | * | 6/2000 | Hata ................. 29/740 |
| 6,101,709 A | * | 8/2000 | Shiota ............... 29/833 |
| 6,189,207 B1 | * | 2/2001 | Nague ............... 29/836 |
| 6,216,336 B1 | * | 4/2001 | Mitsushima ......... 29/240 |
| 6,257,391 B1 | * | 7/2001 | Nishimori ......... 198/358 |
| 6,260,260 B1 | * | 7/2001 | Suhara ............... 29/240 |

FOREIGN PATENT DOCUMENTS

| | | | |
|---|---|---|---|
| EP | 0860102 B1 | * | 10/1996 |
| JP | 03234096 | | 10/1991 |

* cited by examiner

*Primary Examiner*—Peter Vo
*Assistant Examiner*—Alan M. Boswell
(74) *Attorney, Agent, or Firm*—Wenderoth, Lind & Ponack, L.L.P.

(57) ABSTRACT

An electronic components mounting device has a plurality of feeder bases attached with tape feeders thereon, and a guide rail and a cylinder for drawing each of the feeder bases independently to a position for replenishing electronic components. When an electronic component runs out of the storage, only the feeder base that is carrying the relevant tape feeder gone out of the stock is drawn to a place for parts replenishment; in the mean time, the mounting actions keep on going by making use of tape feeders attached on other feeder base. Machine stop times can be decreased with the mounting device.

6 Claims, 6 Drawing Sheets

ELECTRONIC COMPONENTS MOUNTING DEVICE AND THE MOUNTING METHOD

BACKGROUND OF THE INVENTION

The present invention relates to a device for mounting electronic components on a substrate and the method of mounting.

A device for mounting semiconductor chips, or other such electronic components, on a substrate comprises a feeding section for supplying electronic components, which feeding section being provided with a number of parts feeders, such as tape feeders. Each of the respective parts feeders stores electronic components for a certain predetermined quantity. As soon as the supply of an electronic component stops during mounting operation, relevant parts feeder needs to be replenished with new electronic components. For conducting the components replenishment operation, conventionally, the mounting device has to be stopped once in its mounting action and the mounting operation can only be resumed after the relevant parts feeder is filled with the electronic components.

Recently, as a result of the increased number of component counts mounted on one substrate and the increased speed of mounting, the frequency of discontinuation of the supply of parts during mounting operation has increased. Consequently, a mounting device is compelled to stop the mounting action quite often for the replenishment of electronic components. Loading rate of mounting devices has thus been deteriorating, and there has been a strong request to decrease the frequency of machine stops.

SUMMARY OF THE INVENTION

The present invention aims to offer an electronic components mounting device, as well as the method of mounting, with which the frequency of machine stops due to discontinued parts supply can be lowered to an improved machine loading rate.

An electronic components mounting device in accordance with the present invention comprises a feeding section for feeding electronic components and a transfer head for picking up and mounting the electronic component provided through the feeding section on a substrate. The feeding section is formed of a plurality of feeder bases having parts feeders detachably attached thereon, and drawing means for drawing each of the feeder bases independently to each other to a position for replenishing the electronic components.

A method of mounting electronic components in accordance with the present invention comprises the steps of attaching the parts feeders on each of the plurality of feeder bases, and transferring electronic components stored in the parts feeder on a substrate using the transfer head. When replenishing either one of the parts feeders with electronic components, only a feeder base having the parts feeder that needs components replenishment is drawn to a position for replenishing the electronic components.

With an electronic components mounting device of the present invention, it is possible to draw out only a feeder base having the parts feeder that has caused discontinuation of component supply, while the mounting action can keep on going using other parts feeders attached on the remaining feeder base. This arrangement significantly contributes to reduce the stop times of a mounting device due to discontinuation of the components supply.

Furthermore, in a case where a tape feeder is used for the parts feeder, it is preferred to organize so that, while a feeder base has been drawn to the position for replenishing the electronic components, the front cut end of empty tape stays within a discharge guide section which has been provided for guiding the empty tape. Under such configuration, it turns out to be unnecessary to insert the front end of an empty tape into the discharge guide section again at each time of components replenishment.

It is also preferred that the tape feeders that handle tapes of a same tape material are attached on a same feeder base. By so organizing, the empty tapes can be reclaimed separately by the materials in the reclaim boxes provided under the respective feeder bases.

BRIEF DESCRIPTION OF THE DRAWINGS

FIG. 5($a$), FIG. 5($b$) and FIG. 5($c$) exhibit how the empty tape cutter operates.

FIG. 6($a$) and FIG. 6($b$) are perspective views which illustrate operation of the empty tape discharge section of the mounting device.

DESCRIPTION OF THE PREFERRED EMBODIMENTS

Figure 1:
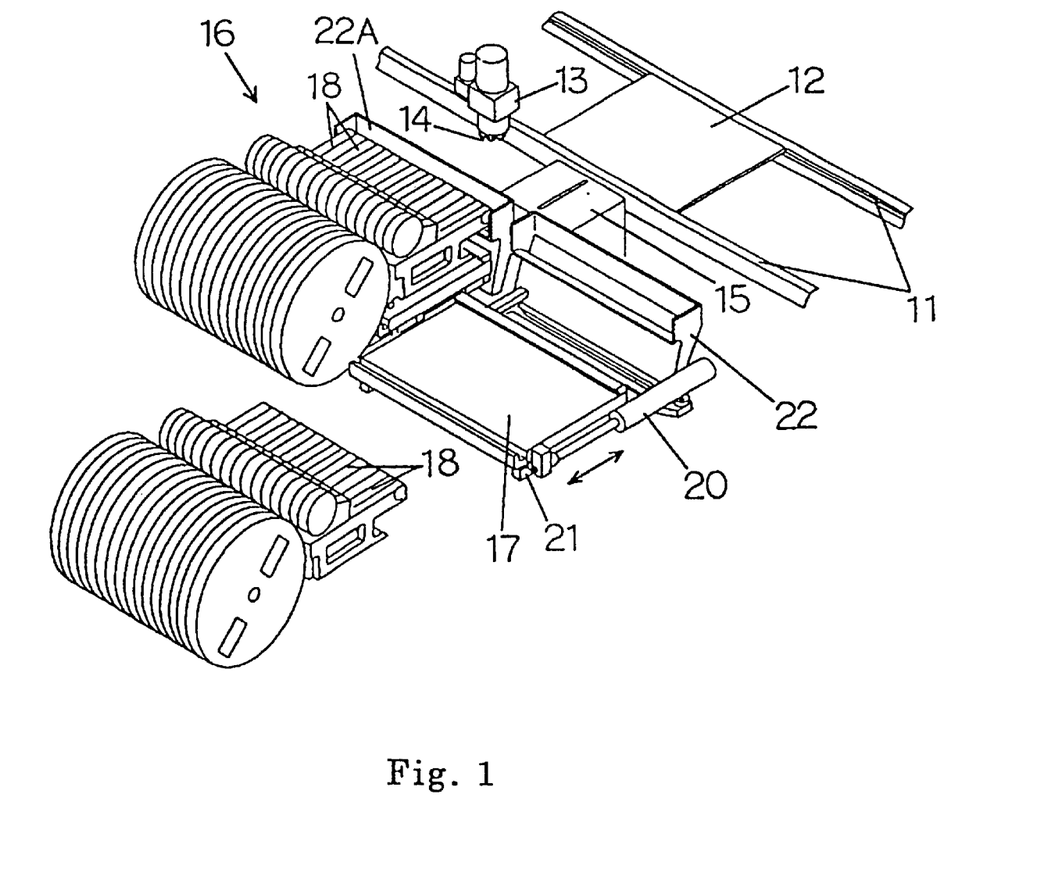
FIG. 1 is a perspective view of an electronic components mounting device in accordance with an exemplary embodiment of the present invention.

The structure of a mounting device in accordance with the present invention is described in the below. As shown in FIG. 1, a substrate 12 is provided on a carrying path 11. At a side of the carrying path 11 is a feeding section 16 for supplying electronic components, which feeding section comprises a plurality of tape feeders 18 disposed in parallel. The tape feeder 18 transfers an electronic component to a pick up location of transfer head 13 by forwarding a tape storing electronic components at a certain pitch. The transfer head 13 is moved by driving means (not shown) in horizontal direction, and picks up electronic component with a nozzle 14 provided at the bottom for mounting it on the substrate 12. A recognition section 15 is provided in a place between the feeding section 16 and the carrying path 11. The recognition section 15 is for recognizing the electronic component being held by the transfer head 13.

The feeding section 16 has a plurality of (two in the present embodiment) feeder bases 17. The feeder base 17 can slide forward and backward along a guide rail 21, a cylinder 20 drives the feeder base 17 in the direction indicated with an arrow mark. There are a plurality of tape feeders 18 on the feeder base 17. In case when any one of the tape feeders 18 runs out of the electronic component, the feeder base 17 slides to bring the tape feeder 18 to a position for replenishing the electronic components. When, each of the plurality of feeder bases 17 can be drawn to the position independently to each other. The guide rail 21 and the cylinder 20 constitute the means for drawing the feeder base 17.

Figure 2:
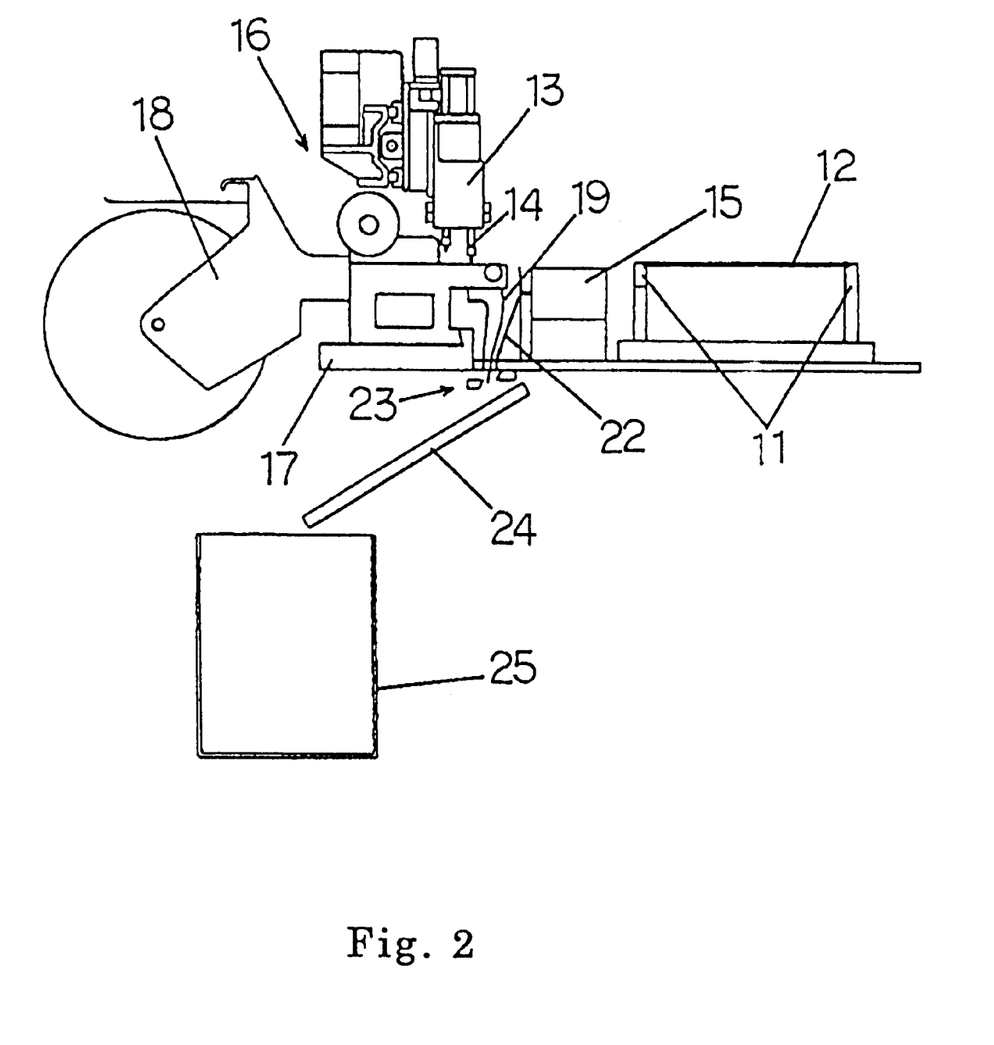
FIG. 2 is a cross sectional side view of the mounting device.
Figure 6A:
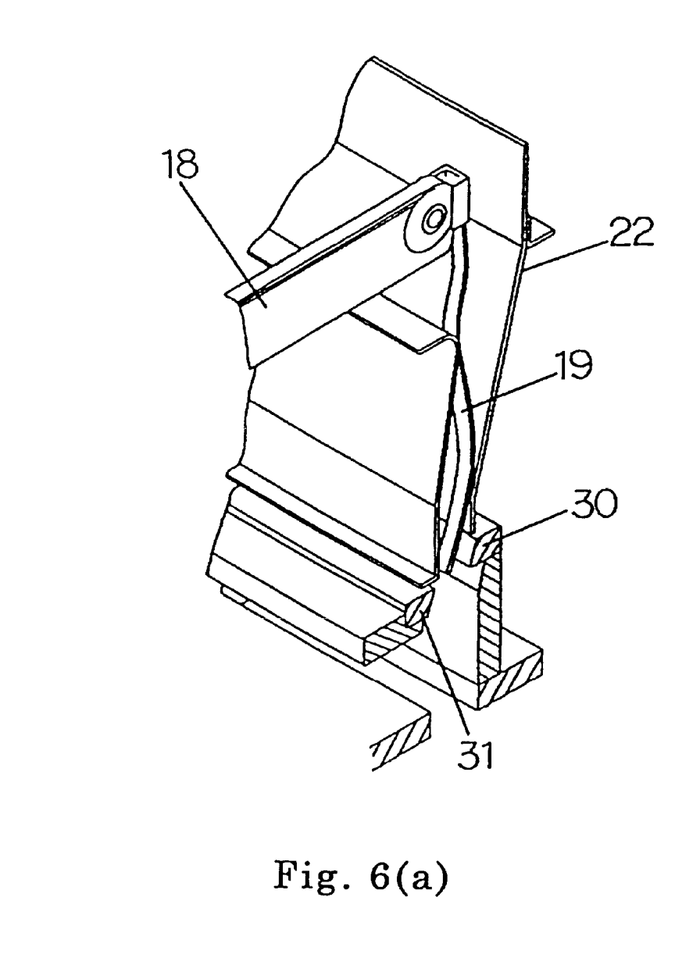

Provided in a place at the front end (the carrying path 11 end, in FIG. 1) of the tape feeder 18 is a discharge duct 22, or a discharge guide section, for guiding empty tape (the tape after the electronic component stored therein was picked up). The discharge duct 22 has a wide mouth at the top, as shown in FIG. 2, which guides an empty tape 19 discharged from the front end of the tape feeder 18 downward (ref. also FIG. 6(a)).

Figure 6B:
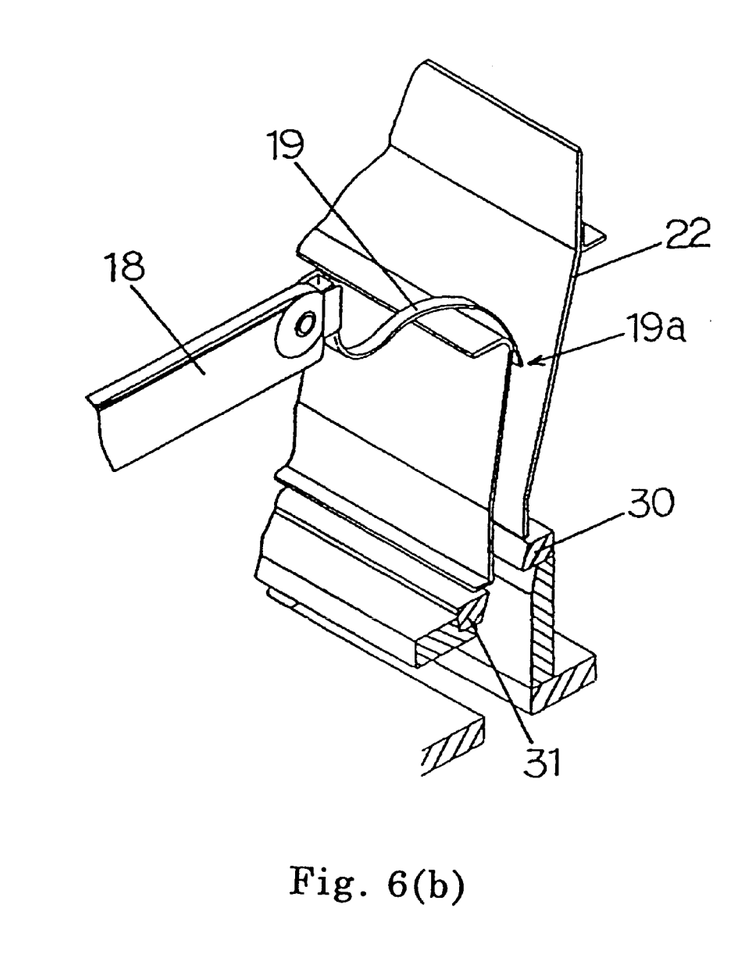

At the bottom exit of discharge duct 22, an empty tape cutter 23, or means for cutting the empty tape 19, is provided. The empty tape cutter 23 is for cutting empty tape 19 guided downward in the discharge duct 22. The position of cutting is organized so that the front cut end 19a of empty tape 19 stays within the discharge duct 22, or the empty tape is not totally withdrawn from the discharge duct 22, as illustrated in FIG. 6(b), even at a state when feeder base 17 is drawn to the position for replenishing electronic components to tape feeder 18. By so organizing the cutting position for the empty tapes, it turns out to be unnecessary to insert the front cut end 19a of other tape feeders 18 into the discharge duct 22 at every time when a feeder base 17 is drawn to the parts replenishment position.

Provided beneath the empty tape cutter 23 is a guide member 24, which is for guiding the cut empty tape 19 downward obliquely into an empty tape reclaim box 25 disposed under the feeding section 16. The reclaim box 25 is means for collecting the empty tapes 19.

Figure 3:
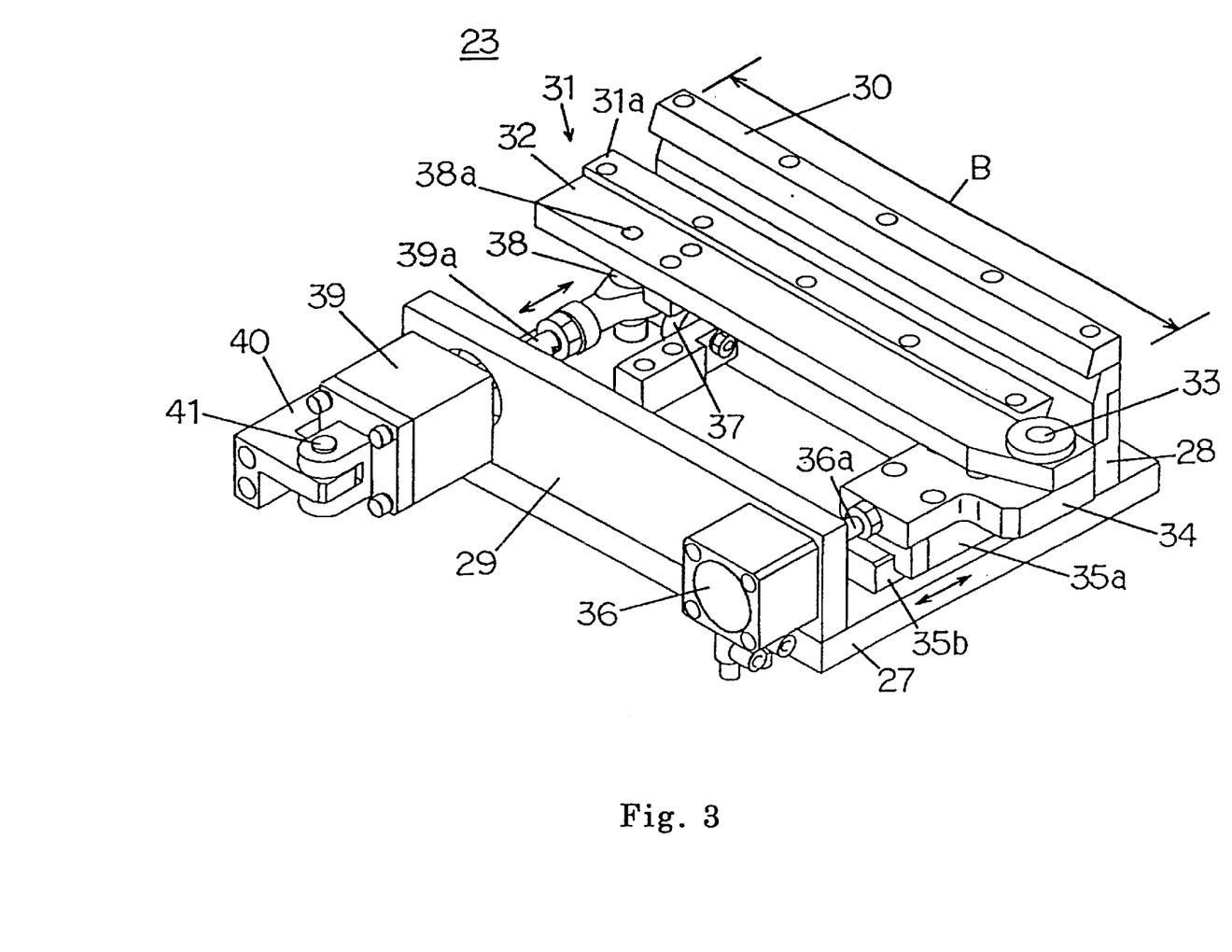
FIG. 3 is a perspective view of an empty tape cutter in the mounting device.

Now, the empty tape cutter 23 is described with reference to FIG. 3. A plate-shaped holding member 28 is provided standing on a base member 27. The holding member 28 holds a fixed knife 30 for cutting empty tape. Length B of the fixed knife 30 is identical to width of the feeder base 17, or a range of the attached tape feeders 18.

A moving knife 31 is installed encountering to the fixed knife 30. When cutting the empty tapes, the fixed knife 30 is positioned with the empty tape 19 interposed in between. The moving knife 31 is formed of a knife blade 31a which is fixed on a plate 32; the plate 32 has axial pivots at both ends. First axial pivot is a pin 33 provided at the right end of the plate 32, which pin 33 is connected with a plate 34. The plate 34 is provided so that it can slide freely in the direction of the arrow mark on a slider 35a and a guide rail 35b installed on the base member 27. The plate 34 is coupled with a rod 36a of cylinder 36 which is fixed on a bracket 29. The piston action of the rod 36a moves the pin 33, which has been fixed on the plate 34, forward to and backward from the fixed knife 30.

Connected at the left end of the plate 32 is a pin 38a of a rod end component 38, which component 38 is connected with a rod 39a of cylinder 39. The cylinder 39 is supported at the rear end by a crevice pivot 41, which has been pin-coupled with a supporting member 40 extruding backward from the bracket 29. The piston action of rod 39a moves the pin 38a forward to and backward from the fixed knife 30.

Next, pneumatic circuit of the empty tape cutter 23 is described with reference to FIG. 4. Respective ports of the cylinders 36 and 39 are connected with pneumatic piping via a variable iris diaphragm 45, which functions as speed controller. The outlet port and the inlet port of the cylinders are connected respectively with port B and port A of a 5-port magnetic valve 46. Port P of the magnetic valve 46 is connected with a pneumatic source 48, while ports R1 and R2 are opened to the atmospheric air via a silencer 47.

Figure 4:
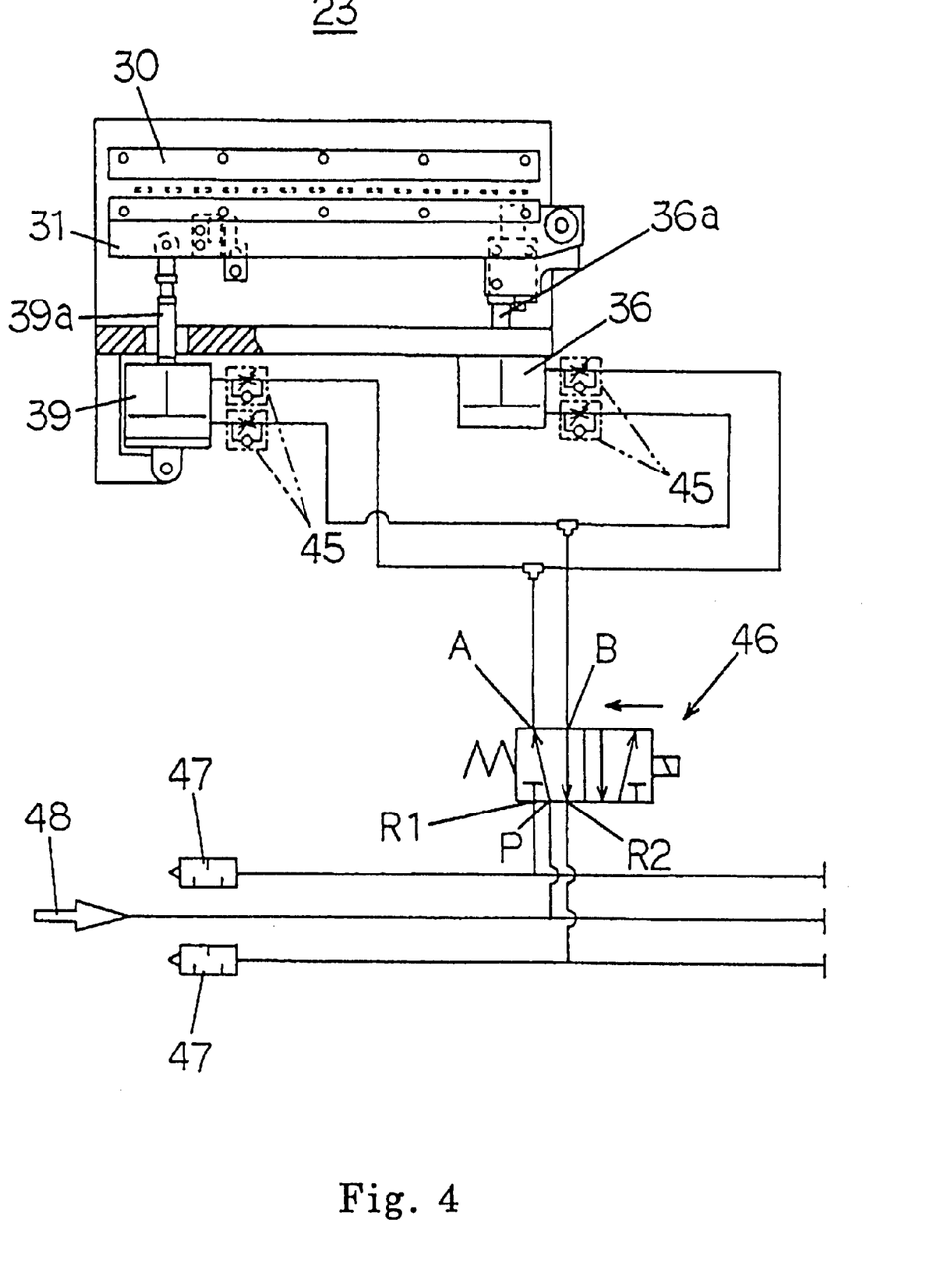
FIG. 4 shows a pneumatic circuit diagram of the empty tape cutter.

In the state of FIG. 4, the air coming from the port A is delivered to the inlet port of cylinders 36, 39, making both of the rods 36a, 39a retracted; then, the moving knife 31 is staying at a retracted position. When the magnetic valve 46 is switched to the direction of an arrow mark, the air is supplied via the port B to the outlet port of cylinders 36, 39. Thereby, the rods 36a, 39a push out, and the moving knife 31 proceeds towards the fixed knife 30. The proceeding speed of the rod 36a and the rod 39a may be controlled individually by adjusting the opening of iris diaphragm 45 attached to respective cylinders 36, 39. Therefore, the moving knife 31 may be made to proceed at different speeds in the right end and in the left end.

Figure 5A:
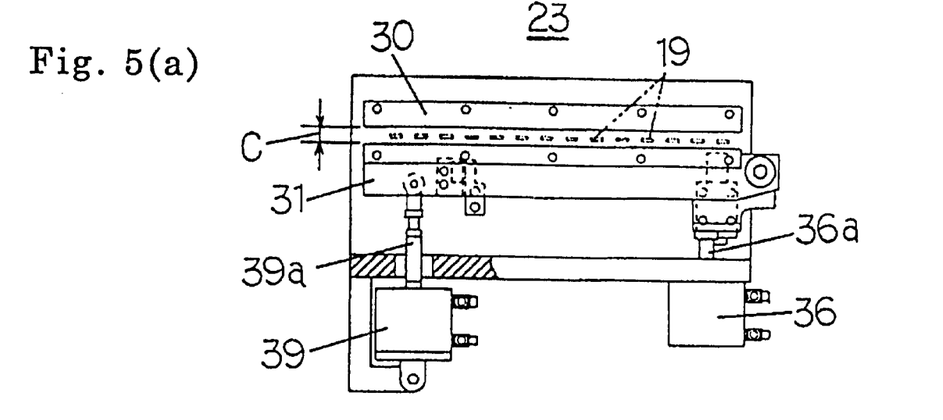

Now in the following, how the moving knife 31 proceeds for cutting the empty tapes 19 is described referring to FIG. 5(a), FIG. 5(b) and FIG. 5(c). FIG. 5(a) illustrates a state before starting the cutting operation; where, both the rods 36a, 39a of cylinders 36 and 39 are retracted, and cutting edge of the moving knife 31 is at a retracted position encountering substantially in parallel with the fixed knife 30 keeping a clearance C in between. In this state, a number of empty tapes 19 come down in the space of clearance C guided by the discharge duct 22, and the empty tapes are cut with a certain predetermined timing.

Cutting operation is initiated by switching of the magnetic valve 46 (ref. FIG. 4). When, as shown in FIG. 5(b), the rod 36a protrudes first (ref. arrow mark a), and then the rod 39a follows with some delay (ref. arrow mark b). The delay is produced by adjusting the opening of the variable iris diaphragm 45 of the cylinders 36, 39 to make the operating speed of rod 36a faster than that of rod 39a. By introducing such a configuration, motion of the knife in the above described mode may be created through the use of only one magnetic valve. Thus, the control system for cutter 23 may be simplified.

The moving knife 31 has been connected at the right end with the plate 24 via the pin 33, while it has been connected at the left end with the rod 39a via the pin 38a and the cylinder 39 has been supported via the crevice pivot 41. Therefore, the moving knife 31 is allowed to make a revolving motion (ref arrow mark c) within a plane containing the moving knife 31 and the fixed knife 30, and the cylinder 39 is allowed to make a revolving motion (ref. arrow mark d) around the crevice pivot 41, which revolving motions have been caused by the rod 36a and the rod 39a protruding respectively at different speeds. Namely, the moving knife 31 makes both a proceeding action towards the fixed knife 30 and a revolving action around the pin 33; thereby cutting the empty tapes 19 placed between the fixed knife 30 and the moving knife 31.

Figure 5B:
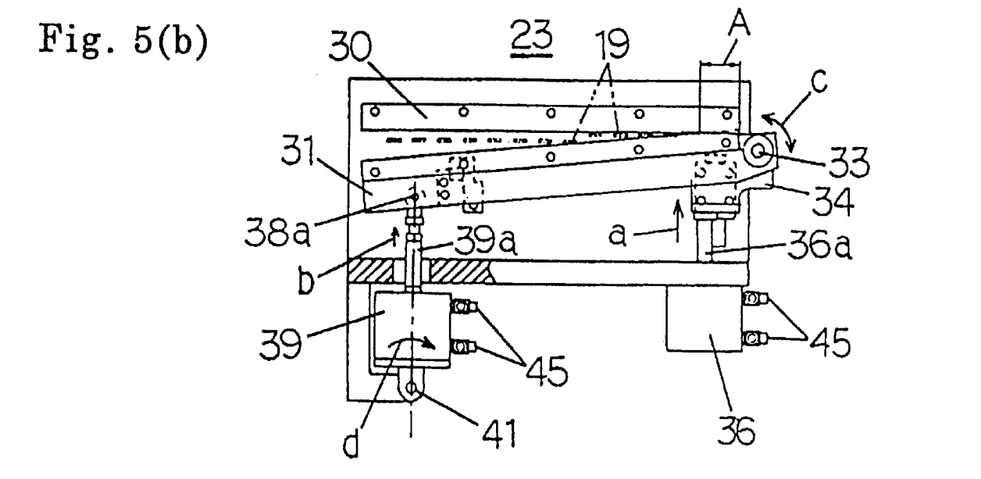

The empty tape 19 locating in a region A and the vicinity shown in FIG. 5(b) is cut first, and then along with the further protruding motion of the rod 39a other empty tapes 19 are cut one after the other. Namely, although a number of empty tapes 19 are coming out of the tape feeders 18 at the same time, the number of empty tapes that should be cut at once is not that many. Therefore, the cylinders 36, 39, which are the generators against cutting load, are required to have only a certain capacity enough for cutting the above-described limited number of empty tapes. This enables to make the cutting mechanism small and compact. Even in a case where there are a substantial number of empty tapes for cutting, the cutting mechanism of above described configuration can cut the substantial number of empty tapes at one cutting operation with a small cutting load, as it cuts the tapes one after the other starting from a tape located at a side. Thus, a substantial number of empty tapes may be cut at one cutting operation efficiently.

Figure 5C:
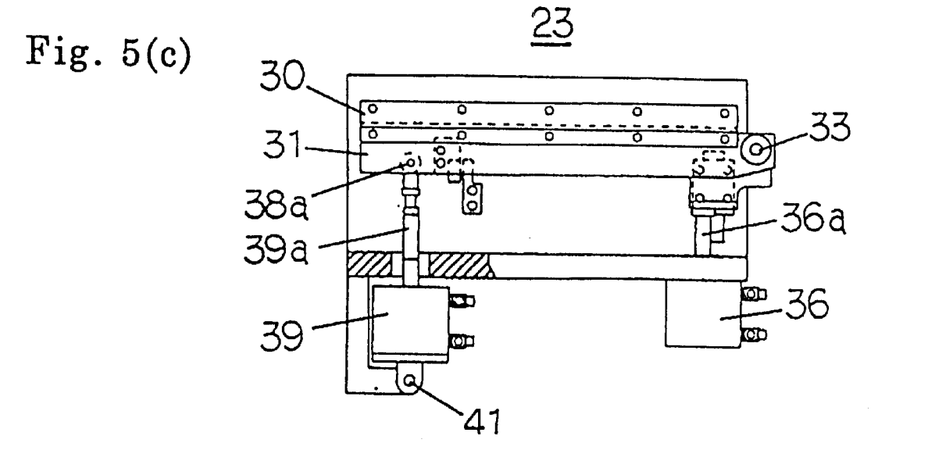

FIG. 5(c) illustrates a state when the rod 39a was fully pushed out to. finalize the cutting; edge of the moving knife 31 is overlapped to the fixed knife 30. Retracting the rods 36a, 39a of cylinders 36, 39 completes the operation of cutting the empty tapes 19. By optimizing the size of cylinders 36, 39 and the action speed of rods 36*a*, 39*a*, the empty tape cutter 23 performs an efficient cutting operation that fits to physical properties of a cutting object.

Now operation of the electronic components mounting device is described below. Before starting the mounting device for mounting electronic components on substrate 12, tape feeders 18 have to be attached on the feeding section 16. The overall placing arrangement of tape feeders 18 on feeder bases 17 is determined taking the type of electronic components, as well as the material of tapes holding the electronic components, into consideration. The tapes are normally made of either paper or resin; tape feeders 18 handling a same tape material should preferably be placed on a same feeder base 17.

The mounting action is started after the fitting of tape feeders 18 on feeding section 16 is completed. Electronic components provided through each of the tape feeders 18 are picked up one after the other by the transfer head 13, and the components are mounted on the substrate 12 after undergoing a position recognition conducted by the recognition section 15. When this operation is kept on going in accordance with a certain predetermined mounting program, the electronic components stored in respective tape feeders 18 are consumed, and the tape feeder will in turn run out of the stock of electronic components.

As soon as the components stock runs out, it needs to be replenished. For the replenishment operation, a feeder base 17 that is carrying the relevant tape feeder 18 that has run out of the stock is drawn to a place for replenishment, and the relevant tape reel is replaced. During the replenishment operation, only a feeder base 17, among the plurality of feeder bases 17, carrying the tape feeder 18 that has run out of stock is drawn to the replenishment position; in the mean time, other feeder base 17 stays in the place and supply of electronic components continues from the tape feeders 18 thereon. Therefore, the mounting action for electronic components does not need to be discontinued while the replenishment is going on. Thus the loading rate is improved with the mounting device.

During the above described ongoing mounting operation, each of the tape feeder 18 discharges the empty tape 19 after the electronic component stored therein is picked up. The empty tape 19 is guided by the discharge duct 22 to be cut by the empty tape cutter 23. The cut tape slides down on the guide member 24 and drops into the empty tape reclaim box 25. As each of the feeder bases 17 is provided with one reclaim box 25 of its own, and one feeder base is attached with the tape feeders 18 of a same tape type, respective reclaim boxes 25 will have empty tapes 19 of a same tape type.

The position of cutting empty tape 19 has been organized so that the front cut end 19*a* stays within the discharge duct 22 even when a feeder base 17 is drawn to the replenishment position. Therefore, it is not necessary to put the front cut end 19*a* of empty tapes into the discharge duct 22 again every time when a replenishment operation is finished. This helps having a replenishment operation finished within a short period of time.

As described in the foregoing, the feeder section of an electronic components mounting device of the present invention is provided with a plurality of feeder bases carrying the parts feeders. When replenishing electronic components to a parts feeder that has run out of stocks, only a feeder base that has the relevant parts feeder thereon is drawn to the replenishment position. As a result, the mounting actions can be continued by making use of other parts feeders attached on other feeder base, even during the replenishment operation is under way. In this way, machine stop times can be decreased with the mounting device, and the loading rate can be improved.

What is claimed is:

1. A method of mounting electronic components on a substrate with a transfer head, said method comprising:

attaching a plurality of first tape feeders on a first feeder base and a plurality of second tape feeders on a second feeder base, wherein: the first and second feeder bases are disposed in a series along a carrying path for carrying the substrate; each of the first and second feeder bases is kept stationary in a direction parallel to the carrying path; and each of the tape feeders is capable of storing some of the electronic components on a tape;

transferring the electronic components from at least one of the first tape feeders on the first base to the substrate with the transfer head;

guiding an empty portion of the tape, from which the electronic components have been picked up by the transfer head, of each of the plurality of first tape feeders into a discharge duct with a discharge guide section; and replenishing the electronic components of a first tape feeder that has run out of electronic components by drawing the first feeder base away from the carrying path to a position of replenishment of the electronic components while: (1) keeping tape front cut ends in the discharge duct; (2) maintaining in position the second tape feeders and the second feeder base; (3) moving the transfer head horizontally; and (4) continuing transferring of electronic components with the transfer head from at least one of the second tape feeders to the substrate.

2. A method according to claim 1, further comprising:

providing at least one reclaim box;

cutting off a portion of the empty portion of the tape, from which the electronic components have been picked up by the transfer head, of at least one of the plurality of first and second tape feeders; and collecting the portion of the tape that has been cut off in the reclaim box.

3. A method of mounting electronic components on a substrate with a transfer head, said method comprising:

placing a plurality of first tape feeders on a first feeder base and a plurality of second parts feeders on a second feeder base, wherein: the first and second feeder bases are disposed at a pickup location of the transfer head in a series along a carrying path for carrying the substrate; each of the first and second feeder bases is kept stationary in a direction parallel to the carrying path; and each of the tape feeders is capable of storing some of the electronic components on a tape;

transferring the electronic components from at least one of the first tape feeders to the substrate with the transfer head by picking up the electronic components at the pick up location;

guiding an empty portion of the tape, from which the electronic components have been picked up by the transfer head, of each of the plurality of first tape feeders into a discharge duct with a discharge guide section; and replenishing the electronic components of a first tape feeder that has run out of electronic components by drawing the first feeder base away from the carrying path to an area that is out of the pick up location while: (1) keeping tape front cut ends in the discharge duct; (2) maintaining in position the second tape feeders and the second feeder base; (3) moving the transfer head horizontally; and (4) continuing transferring of electronic components with the transfer head from at least one of the second tape feeders to the substrate.

4. A method according to claim 3, further comprising:

providing at least one reclaim box;

cutting off a portion of the empty portion of the tape, from which the electronic components have been picked up by the transfer head, of at least one of the plurality of first and second tape feeders, and collecting the portion of the tape that has been cut off in the reclaim box.

5. A method of mounting electronic components on a substrate with a transfer head, said method comprising:

attaching a plurality of first tape feeders on a first feeder base and a plurality of second tape feeders on a second feeder base, wherein: the first and second feeder bases are disposed in a series along a carrying path for carrying the substrate; each of the first and second feeder bases is kept stationary in a direction parallel to the carrying path; and each of the tape feeders is capable of storing some of the electronic components on a tape;

transferring the electronic components from at least one of the first tape feeders and at least one of the second tape feeders to the substrate with the transfer head;

guiding an empty portion of the tape, from which the electronic components have been picked up by the transfer head, of each of the plurality of first and second tape feeders into a discharge duct with a discharge guide section; and replenishing the electronic components of a first tape feeder that has run out of electronic components by drawing the first feeder base away from the carrying path to a position of replenishment of the electronic components while: (1) keeping tape front cut ends in the discharge duct; (2) maintaining in position the second tape feeders and the second feeder base; (3) moving the transfer head horizontally; and (4) continuing transferring of electronic components with the transfer head from at least one of the second tape feeders to the substrate.

6. A method according to claim 5, further comprising:

providing at least one reclaim box;

cutting off a portion of the empty portion of the tape, from which the electronic components have been picked up by the transfer head, of at least one of the plurality of first and second tape feeders; and collecting the portion of the tape that has been cut off in the reclaim box.

* * * * *